United States Patent
Park et al.

(10) Patent No.: US 7,692,197 B2
(45) Date of Patent: Apr. 6, 2010

(54) ACTIVE MATRIX ORGANIC LIGHT EMITTING DISPLAY (OLED) AND METHOD OF FABRICATION

(75) Inventors: Sang-Il Park, Suwon-si (KR); Iee-Gon Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 10/981,559

(22) Filed: Nov. 5, 2004

(65) Prior Publication Data

US 2005/0110021 A1   May 26, 2005

(30) Foreign Application Priority Data

Nov. 22, 2003   (KR) ............. 10-2003-0083391

(51) Int. Cl.
*H01L 27/32*   (2006.01)
(52) U.S. Cl. .............. 257/72; 257/59; 257/E27.119
(58) Field of Classification Search .......... 257/72, 257/57, 59, 66, E27.081–E27.083, E27.117, 257/E27.119; 438/149, 151–166
See application file for complete search history.

(56) References Cited

U.S. PATENT DOCUMENTS

| | | | | |
|---|---|---|---|---|
| 5,877,832 A * | 3/1999 | Shimada | .......... | 349/138 |
| 6,114,715 A * | 9/2000 | Hamada | .......... | 257/72 |
| 6,420,834 B2 | 7/2002 | Yamazaki et al. | | |
| 6,445,005 B1 * | 9/2002 | Yamazaki et al. | .......... | 257/72 |
| 6,617,608 B2 * | 9/2003 | Bae et al. | .......... | 257/40 |
| 6,630,784 B2 * | 10/2003 | Yoneda | .......... | 313/504 |
| 6,757,032 B1 * | 6/2004 | Zhang et al. | .......... | 349/44 |
| 6,831,410 B2 * | 12/2004 | Huang | .......... | 313/506 |
| 6,833,560 B2 * | 12/2004 | Konuma et al. | .......... | 257/72 |
| 6,856,360 B1 * | 2/2005 | Higuchi et al. | .......... | 349/43 |

(Continued)

FOREIGN PATENT DOCUMENTS

CN   1310480   8/2001

(Continued)

OTHER PUBLICATIONS

Office action from the Japanese Patent Office issued in Applicant's corresponding Japanese Patent Application No. 2004-303771, dated Sep. 26, 2006.

(Continued)

*Primary Examiner*—Matthew W Such
(74) *Attorney, Agent, or Firm*—Robert E. Bushnell, Esq.

(57) ABSTRACT

An organic light emitting display includes a substrate having a pixel driving circuit region and an opening region. A thin film transistor having source/drain electrodes is positioned on the pixel driving circuit region of the substrate. A passivation insulating layer is positioned on the source/drain electrodes to have a via hole for exposing one of the source/drain electrodes. A pixel electrode is positioned on a bottom surface of the via hole and in contact with the exposed source/drain electrode, and extends onto the passivation insulating layer. A first photosensitive organic insulating layer is positioned within the via hole in which the pixel electrode is formed to fill the via hole and to expose a portion of the pixel electrode around the via hole. An organic emission layer is positioned on the exposed pixel electrode.

9 Claims, 4 Drawing Sheets

U.S. PATENT DOCUMENTS

| | | | | |
|---|---|---|---|---|
| 6,958,740 | B1 * | 10/2005 | Nishikawa | 345/76 |
| 2001/0019133 | A1 * | 9/2001 | Konuma et al. | 257/79 |
| 2002/0101394 | A1 * | 8/2002 | Anzai | 345/76 |
| 2002/0101556 | A1 * | 8/2002 | Kikkawa et al. | 349/138 |
| 2002/0140643 | A1 * | 10/2002 | Sato | 345/76 |
| 2002/0176992 | A1 * | 11/2002 | Parthasarathy et al. | 428/411.1 |
| 2002/0197875 | A1 * | 12/2002 | Lin et al. | 438/701 |
| 2003/0094615 | A1 * | 5/2003 | Yamazaki et al. | 257/72 |
| 2003/0193054 | A1 * | 10/2003 | Hayakawa et al. | 257/72 |
| 2003/0197466 | A1 * | 10/2003 | Yamazaki et al. | 313/504 |
| 2004/0017162 | A1 * | 1/2004 | Sato et al. | 315/169.3 |
| 2004/0066136 | A1 * | 4/2004 | Yoneda et al. | 313/505 |
| 2004/1012526 | | * 7/2004 | Koo et al. | 349/56 |
| 2005/0005848 | A1 * | 1/2005 | Yamazaki et al. | 118/719 |
| 2005/0070039 | A1 * | 3/2005 | Yamazaki et al. | 438/33 |
| 2005/0082534 | A1 * | 4/2005 | Kim et al. | 257/72 |
| 2005/0093438 | A1 * | 5/2005 | Chen | 313/506 |
| 2005/0116630 | A1 * | 6/2005 | Kim et al. | 313/506 |
| 2006/0139268 | A1 * | 6/2006 | Kobayashi | 345/87 |

FOREIGN PATENT DOCUMENTS

| | | |
|---|---|---|
| CN | 1429055 | 7/2003 |
| CN | 1440224 | 9/2003 |
| JP | 11-087650 | 3/1999 |
| JP | 2001-312223 | 11/2001 |
| JP | 2001-356710 | 12/2001 |
| JP | 2002-268084 | 9/2002 |
| JP | 2003-317958 | 11/2003 |

OTHER PUBLICATIONS

Chinese Office Action issued on Nov. 30, 2007, corresponding to Chinese Patent Application No. 200410075884.3 (with English translation).

*A printout from* www.erriam-webster.com *(Merriam-Webster OnLine) for term "groove"* (p. 1).

*A printout from* www.askoxford.com *(AskOxford.com) for a term "groove"* (p. 1).

*Notice of Allowability* from the Japanese Patent Office issued in Applicant's corresponding Japanese Patent Application No. 2004-303771 dated May 20, 2008.

*Office Action* from the Chinese Patent Office issued in Applicant's corresponding Chinese Patent Application No. 2004100758843 dated Jun. 13, 2008 (along with English translation).

Chinese Letters Patent from Chinese Patent Office issued in Applicant's corresponding Chinese Patent No. 100468764 (Chinese Patent Application No. 200410075884.3) dated Mar. 11, 2009.

* cited by examiner

ACTIVE MATRIX ORGANIC LIGHT EMITTING DISPLAY (OLED) AND METHOD OF FABRICATION

CLAIM OF PRIORITY

This application makes reference to, incorporates the same herein, and claims all benefits accruing under 35 U.S.C. §119 from an application for ACTIVE MATRIX OLED AND METHOD FOR FABRICATING THE SAME earlier filed in the Korean Intellectual Property Office on Nov. 22, 2003 and there duly assigned Serial No. 2003-83391.

BACKGROUND OF THE INVENTION

1. Field of the Invention

The present invention relates to an Organic Light Emitting Display (OLED) and method of fabrication and, more particularly, to an Active Matrix OLED (AMOLED) and method of fabrication.

2. Description of the Related Art

In general, an OLED is an emissive display in which a fluorescent organic compound is electrically excited to emit light therefrom. OLEDs can be classified into passive OLEDs and active OLEDs based on a driving scheme for driving N×M pixels arranged in a matrix form. The AMOLED has a lower power consumption than the passive matrix OLED so that it is advantageously suitable for implementing a large display area thereof and has high resolution.

An AMOLED includes a buffer layer formed on an insulating substrate. An active layer, a gate insulating layer, a gate electrode, an interlayer, and source/drain electrodes are formed on the buffer layer of the insulating layer using typical methods. The source/drain electrodes are in contact with the active layer through a contact hole formed within the interlayer. The active layer, the gate insulating layer, the gate electrode, and the source/drain electrode form a thin film transistor. A passivation layer is formed over the entire surface of the substrate including the thin film transistor, and a via hole for exposing one of the source/drain electrodes is formed within the passivation layer. The passivation layer is an inorganic layer and has bad planarization properties so that it has a groove resulted from patterns below the passivation layer, especially due to topology of the contact hole.

A pixel electrode is then formed to be in contact with the source/drain electrode exposed within the via hole. Since the pixel electrode is formed along the bottom and side walls of the via hole, it is bent within the via hole. A pixel defining layer is then formed to cover the bent pixel electrode within the via hole such that the pixel defining layer has an opening for exposing the pixel electrode at a position spaced apart from the via hole. Then, an organic emission layer is formed on the pixel electrode exposed within the opening, and an opposite electrode is formed on the organic emission layer. The pixel electrode, the organic emission layer, and the opposite electrode form an organic light emitting diode, which is connected to the thin film transistor through the via hole so that it is driven by the thin film transistor.

In the method of fabricating the OLED, the pixel defining layer acts to protect the organic emission layer from being positioned on the bent pixel electrode within the via hole, so that deterioration due to the bent organic emission layer can be prevented. In addition, the topology due to patterns below the passivation layer, especially the topology due to the contact hole can be relaxed to prevent the organic emission layer from being bent or broken above the contact hole.

The pixel defining layer is generally formed of a photosensitive organic insulating layer having good planarization properties, and the photosensitive organic insulating layer contains a sensitizer. When the organic light emitting display is driven, the sensitizer can take a form of outgas to cause the deterioration of the organic emission layer in contact with the pixel defining layer.

SUMMARY OF THE INVENTION

The present invention provides an organic light emitting display and method of fabrication, which can minimize the deterioration of an organic emission layer due to outgas emitted from a photosensitive layer and at the same time can also prevent the deterioration due to bending of the organic emission layer.

In accordance with one aspect of the present invention, a display is provided comprising: a substrate including a pixel driving circuit region and an opening region; a thin film transistor positioned on the pixel driving circuit region and having source/drain electrodes; an insulating layer positioned on the source/drain electrodes and having a via hole adapted to expose one of the source/drain electrodes; a pixel electrode contacting the exposed source/drain electrode in the via hole and extending onto the insulating layer; a first photosensitive layer pattern positioned within the via hole in which the pixel electrode is arranged and adapted to expose a portion of the pixel electrode adjacent to the via hole; and an organic emission layer positioned on the exposed pixel electrode.

The first photosensitive layer pattern preferably comprises one of an acrylic-based polymer and an imide-based polymer.

The insulating layer preferably comprises an inorganic layer.

The inorganic layer preferably comprises a silicon nitride layer.

The first photosensitive layer pattern preferably exposes the portion of the pixel electrode around the via hole.

The insulating layer preferably comprises a groove, and wherein the display preferably further comprises a second photosensitive layer pattern adapted to fill the groove of the insulating layer.

The second photosensitive layer pattern preferably comprises one of an acrylic-based polymer and an imide-based polymer.

The pixel electrode preferably comprises one of Indium Tin Oxide (ITO) and Indium Zinc Oxide (IZO).

The pixel electrode preferably includes a tapered edge.

The tapered edge of the pixel electrode preferably includes a taper angle less than or equal to 20 degrees.

In accordance with another aspect of the present invention, a method of fabricating a display is provided, the method comprising: preparing a substrate to include a pixel driving circuit region and an opening region, the substrate having an upper surface and a lower surface; forming a thin film transistor having source/drain electrodes on the upper surface of the substrate of the pixel driving circuit region; forming an insulating layer on the source/drain electrodes; forming a via hole to expose one of the source/drain electrodes under the insulating layer; forming a pixel electrode contacting the exposed source/drain electrode within the via hole and extending onto the insulating layer; forming an photosensitive layer on the substrate including the pixel electrode; irradiating light onto the lower surface of the substrate to expose the photosensitive layer; developing the exposed photosensitive layer to expose the pixel electrode of the opening region; etching back the developed photosensitive layer to form a first photosensitive layer pattern within the via hole and to expose a portion of the pixel electrode adjacent to the via hole; and forming an organic emission layer on the exposed pixel electrode.

Forming the insulating layer preferably comprises forming an inorganic layer.

Forming the inorganic layer preferably comprises forming a silicon nitride layer.

Forming the insulating layer preferably includes forming a groove therein, and the method preferably further comprises forming a second photosensitive layer pattern to fill the groove when the developed photosensitive layer is etched back.

The pixel electrode is preferably formed of one of Indium Tin Oxide (ITO) and Indium Zinc Oxide (IZO).

The pixel electrode is preferably formed to have a tapered edge.

The tapered edge of the pixel electrode preferably has a taper angle less than or equal to 20 degrees.

The photosensitive layer is preferably formed of one of an acrylic-based polymer and an imide-based polymer.

The photosensitive layer is preferably formed by a spin coating method.

The photosensitive layer is preferably etched back by ashing.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
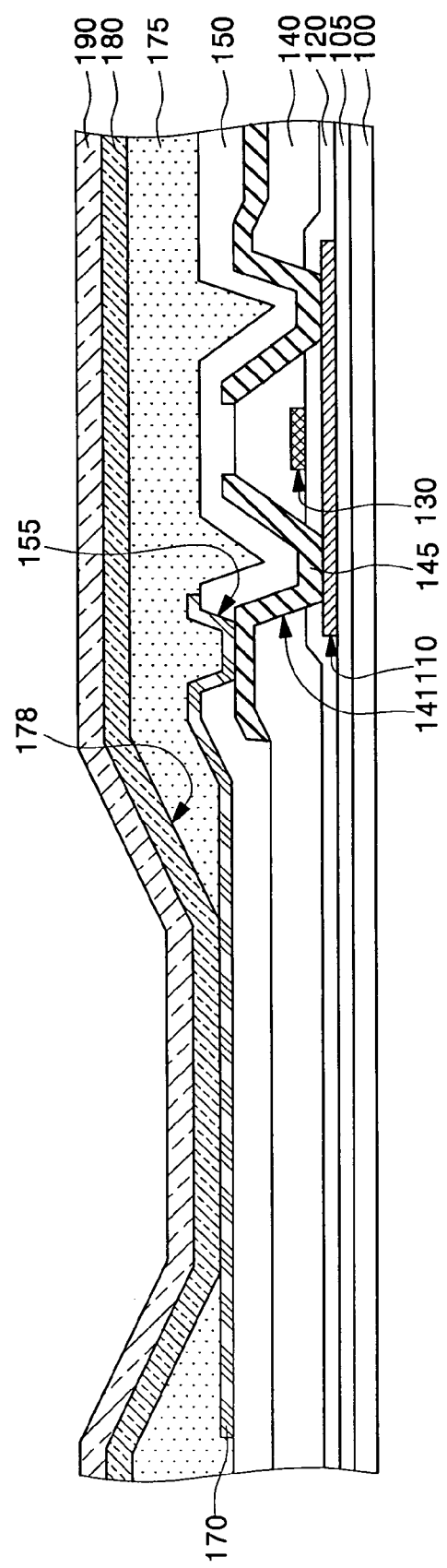
FIG. 1 is a cross-sectional view of an AMOLED and method of fabrication.

FIG. 1 is a cross-sectional view of an AMOLED and method of fabrication.

Referring to FIG. 1, a buffer layer 105 is formed on an insulating substrate 100. An active layer 110, a gate insulating layer 120, a gate electrode 130, an interlayer 140, and source/drain electrodes 145 are formed on the buffer layer 105 of the insulating layer 100. The source/drain electrodes 145 are in contact with the active layer 110 through a contact hole 141 formed within the interlayer 140. The active layer 110, the gate insulating layer 120, the gate electrode 130, and the source/drain electrode 145 form a thin film transistor. A passivation layer 150 is formed over the entire surface of the substrate 100 including the thin film transistor, and a via hole 155 for exposing one of the source/drain electrodes 145 is formed within the passivation layer 150. The passivation layer 150 is an inorganic layer and has bad planarization properties so that it has a groove resulting from patterns below the passivation layer 150, especially due to the topology of the contact hole 141.

A pixel electrode 170 is then formed to contact the source/drain electrode 145 exposed within the via hole 155. Since the pixel electrode 170 is formed along the bottom and side walls of the via hole 155, it is bent within the via hole 155. A pixel defining layer 175 is then formed to cover the bent pixel electrode 170 within the via hole 155 such that the pixel defining layer 175 has an opening 178 for exposing the pixel electrode 170 at a position spaced apart from the via hole 155. Then, an organic emission layer 180 is formed on the pixel electrode 170 exposed within the opening 178, and an opposite electrode 190 is formed on the organic emission layer 180. The pixel electrode 170, the organic emission layer 180, and the opposite electrode 190 form an organic light emitting diode, which is connected to the thin film transistor through the via hole 155 so that it is driven by the thin film transistor.

In the method of fabricating the OLED, the pixel defining layer 175 acts to protect the organic emission layer 180 from being positioned on the bent pixel electrode 170 within the via hole 150, so that deterioration due to the bent organic emission layer 180 can be prevented. In addition, the topology due to patterns below the passivation layer 150, especially the topology due to the contact hole 141 can be relaxed to prevent the organic emission layer 180 from being bent or broken above the contact hole 141.

The pixel defining layer 175 is generally formed of a photosensitive organic insulating layer having good planarization properties, and the photosensitive organic insulating layer contains a sensitizer. When the OLED is driven, the sensitizer can take a form of an outgas to cause the deterioration of the organic emission layer 180 in contact with the pixel defining layer.

The present invention will now be described more fully hereinafter with reference to the accompanying drawings, in which an exemplary embodiment of the present invention is shown. The present invention, however, can be embodied in different forms and should not be construed as being limited to the embodiment set forth herein. Rather, the exemplary embodiment is provided so that this disclosure will be thorough and complete, and will fully convey the scope of the present invention to those skilled in the art.

In the following discussion, a layer described as being formed on another layer or on a substrate is to be interpreted as meaning that the layer can be formed directly on another layer or on the substrate or that a third layer can be interposed between the layer and another layer or the substrate. Like numbers refer to like elements throughout the specification and drawings.

Figure 2A:
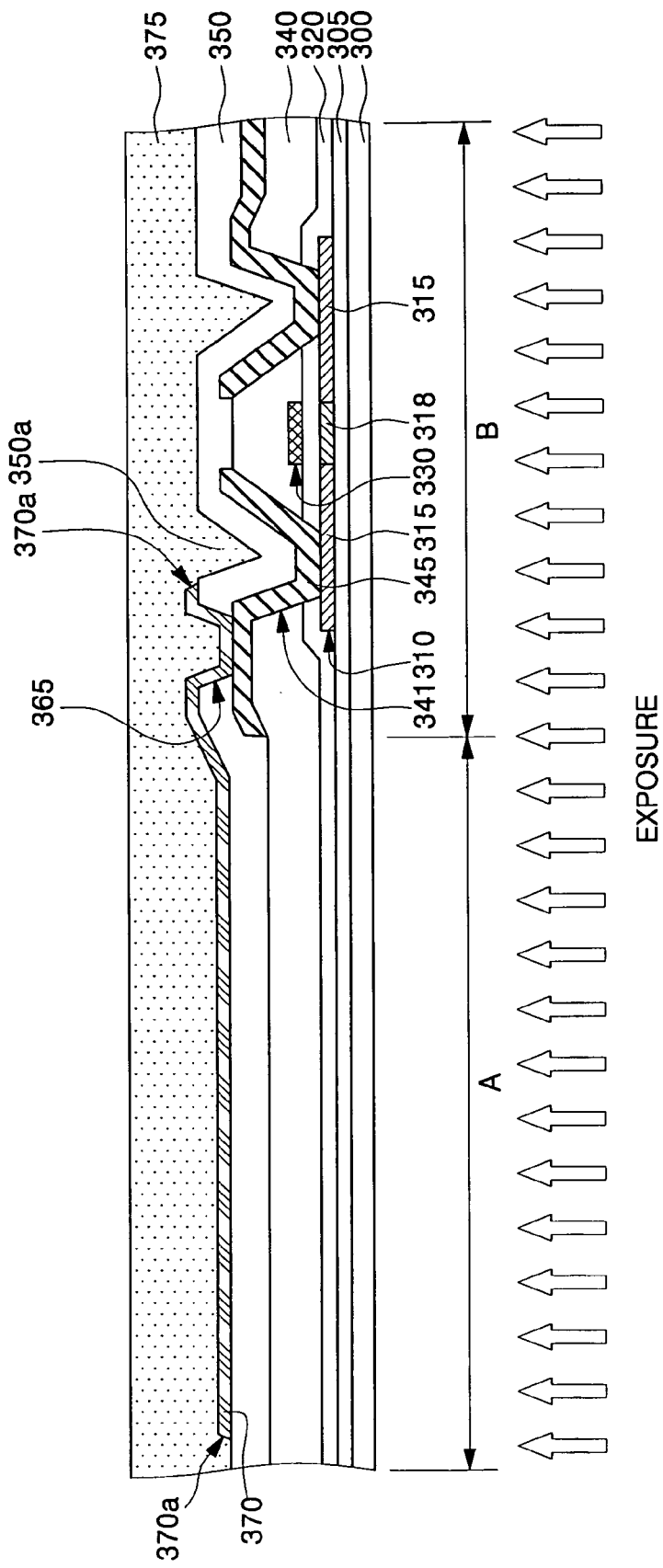
FIG. 2A to FIG. 2C are cross-sectional views of an AMOLED and method of fabrication in accordance with an embodiment of the present invention.
Figure 2B:
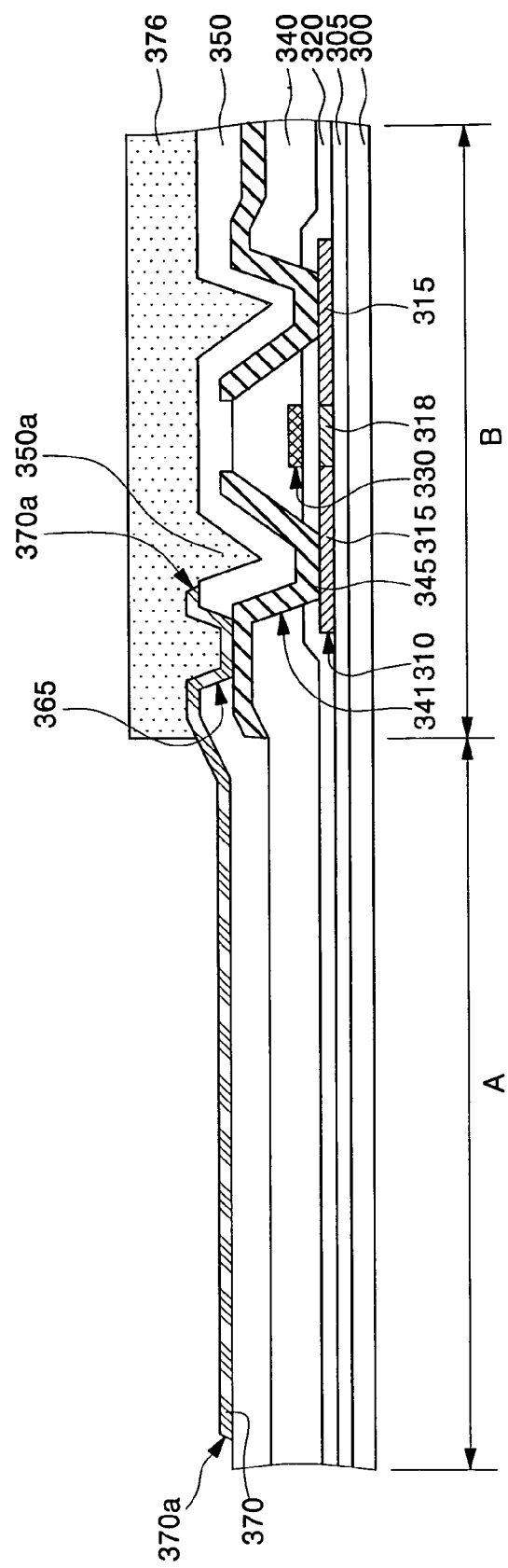
Figure 2C:
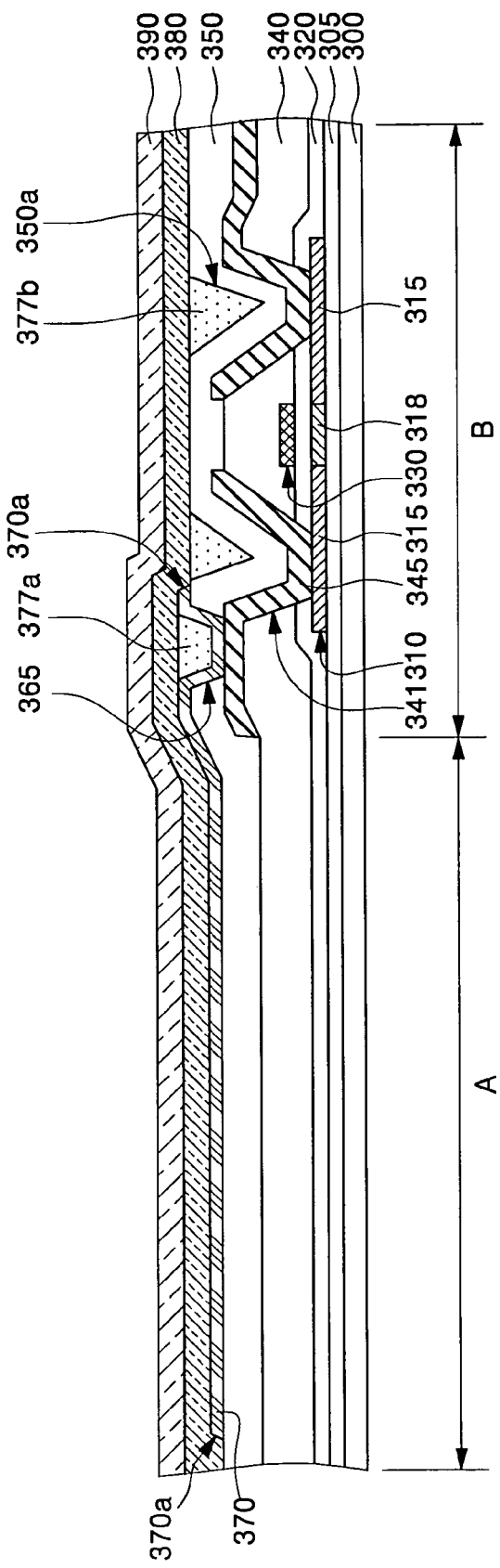

FIG. 2A to FIG. 2C are cross-sectional views of an AMOLED and method of fabrication in accordance with an embodiment of the present invention. The OLED has at least one unit pixel, and these figures are limited to show the unit pixel of the OLED.

Referring to FIG. 2A, a substrate 300 having an opening region A and a pixel driving circuit region B is prepared. The substrate 300 has an upper surface and a lower surface. The substrate 300 can be an insulating substrate. The substrate 300 is preferably a transparent substrate formed of glass or plastic. A buffer layer 305 is then formed on the upper surface of the substrate 300. The buffer layer 305 acts to protect a thin film transistor to be formed in a subsequent process from impurities emitted by the substrate 300, and can be formed of a silicon oxide layer, a silicon nitride layer, a silicon oxynitride layer or a stacked layer thereof.

Subsequently, an active layer 310 is formed on the pixel driving circuit region B of the substrate 300 where the buffer layer 305 has already been formed. The active layer 310 can be formed of amorphous silicon or polycrystalline silicon, and is preferably formed of polycrystalline silicon. A gate insulating layer 320 is formed over the upper surface of the substrate including the active layer 310, and a gate electrode 330 is formed on the gate insulating layer 320 at a position corresponding to a predetermined region of the active layer 310. Impurities are doped into the active layer 310 using the gate electrode 330 as a mask to form source/drain regions 315 in the active layer while a channel region 318 is defined to be interposed between the source/drain regions 315. An interlayer 340 is formed over the upper surface of the substrate including the gate electrode 330. The interlayer 340 can be formed of a silicon oxide layer, a silicon nitride layer, a silicon oxynitride layer or a stacked layer thereof. Contact holes 341 for exposing respective source/drain regions 315 are then formed within the interlayer 340. A conductive layer is deposited on the interlayer 340 and the source/drain regions 315 exposed within the contact holes 341. The deposited conductive layer is patterned, thereby forming source/drain electrodes 345. The source/drain electrodes 345 are respectively in contact with the source/drain regions 315 exposed within the contact holes 341. The active layer 310, the gate electrode 330, and the source/drain electrodes 345 form the thin film transistor.

Then, an insulating layer 350 is formed on the source/drain electrodes 345. The insulating layer 350 can be a passivation layer 350. The passivation layer 350 can be an inorganic layer. The passivation layer 350 is preferably a silicon nitride layer. The passivation layer 350 not only protects the thin film transistor below the passivation layer 350 but also passivates a dangling bond present in a crystal grain boundary of the active layer 310 when the active layer 310 is formed of a polycrystalline silicon. Such a passivation layer 350 has bad planarization properties, so that it has a groove 350a resulting from a topology due to patterns below the passivation layer 350, especially due to the contact hole 341.

A via hole 365 is then formed within the passivation layer 350 to expose one of the source/drain electrodes 345. A transparent conductive layer is deposited on the passivation layer 350, and is patterned to form a pixel electrode 370. The pixel electrode 370 is in contact with the exposed source/drain electrode 345 in the via hole 365, specifically at the bottom of the via hole 365. The pixel electrode 370 extended onto the passivation layer 350. The pixel electrode 370 is preferably formed to have a tapered edge 370a when the deposited transparent conductive layer is patterned. More preferably, the taper angle is 20° or less. The transparent conductive layer, namely, the pixel electrode 370 is preferably formed of Indium Tin Oxide (ITO) or Indium Zinc Oxide (IZO).

A photosensitive layer 375 is then formed on the substrate including the pixel electrode 370 such that the photosensitive layer 375 fills the via hole 365 where the pixel electrode 370 is formed and the groove 350a. It is preferable for the photosensitive layer 370 to have superior planarization properties. The photosensitive layer 370 having superior planarization properties can relax the topology of the passivation layer 350 to have a planarized surface. For this reason, the photosensitive layer 375 is preferably an organic layer. The photosensitive layer 375 is a positive type so that it has a property that it is changed into a material to be dissolved in a developing solution when exposed to light. The photosensitive layer 375 is preferably formed of an acrylic-based polymer or an imide-based polymer (polyimide). Furthermore, the photosensitive layer 375 can be formed on the substrate using a spin-coating method.

Then, light is irradiated onto the lower surface of the substrate 300 where the photosensitive layer 375 has already been formed to perform back exposure to the photosensitive layer 375. On the opening region A of the substrate 300, the buffer layer 305, the gate insulating layer 320, the interlayer 340, and the passivation layer 350 are sequentially deposited, so that the light incident from the lower surface of the substrate 300 can be transmitted. Thus, the photosensitive layer 375 formed on the passivation layer 350 of the opening region A is exposed to the light. On the pixel driving circuit region B of the substrate, the active layer 310, the gate electrode 330, gate wiring (not shown), the source/drain electrodes 345, data wiring (not shown), and power supply wiring (not shown) are disposed, wherein the active layer 310 is formed of silicon, and the gate electrode 330, the source/drain electrodes 345, and the data wiring and power supply wiring are formed of metal so that the light can not be transmitted therethrough. Thus, the photosensitive layer 375 formed on the passivation layer 350 of the pixel driving circuit region B, is not exposed to the light incident from the lower surface of the substrate 300. As a result, a portion of the photosensitive layer 375 exposed to the light, namely, a portion on the opening region A is changed into a material that can be dissolved in a developing solution whereas the photosensitive layer 375 on the pixel driving circuit region B is not changed.

Referring to FIG. 2B, the photosensitive layer 375 is developed using the developing solution. In this case, the photosensitive layer 375 on the opening region A is dissolved by the developing solution and removed, so that the pixel electrode 370 on the opening region A is exposed. A developed photosensitive layer 376 is disposed on the pixel driving circuit region B including the upper portion of the via hole 365.

Referring to FIG. 2C, the developed photosensitive layer 376 is etched back until the passivation layer 350 is exposed. The developed photosensitive layer 376 is anisotropically etched from its upper portion by the etch back, thereby forming a first photosensitive layer pattern 377a and a second photosensitive layer pattern 377b.

The first photosensitive layer pattern 377a is positioned within the via hole 365, specifically, to fill the via hole 365 where the pixel electrode 370 is formed, and to expose a portion of the pixel electrode adjacent the via hole 365. The first photosensitive layer pattern 377a expose the pixel electrode 370 around the via hole. The second photosensitive layer pattern 377b fills the groove 350a of the passivation layer 350 to expose the passivation layer 350 of the pixel driving circuit region B. As a result, both the upper portion of the via hole 365 and the upper portion of the groove 350a can be planarized.

The etchback can be performed by ashing. Gases used for the ashing can include O2, Ar, CF4, and SF6. When the ashing is performed, upper portions of the first and second photosensitive layer patterns 377a and 377b exposed to the ashing gas can be cured to reduce outgassing.

Then, an organic emission layer 380 is formed over the upper surface of the substrate including the first and second photosensitive layer patterns 377a and 377b. As a result, the organic emission layer 380 is formed not only on the exposed pixel electrode 370 but also on an edge 370a of the pixel electrode 370. As mentioned above, the pixel electrode 370 is formed to have the tapered edge 370a, so that deterioration of the organic emission layer 380 due to bias focused on the edge 370a of the pixel electrode 370 can be suppressed. The organic emission layer 380 can be patterned per unit pixel so as to implement a full color OLED. The organic emission layer 380 can be patterned by a laser induced thermal imaging method, a vacuum deposition method using a shadow mask, or the like. An opposite electrode 390 is then formed on the organic emission layer 380. The opposite electrode 390 can be formed over the entire surface of the substrate. The pixel electrode 370, the organic emission layer 380, and the opposite electrode 390 form an organic light emitting diode, which is connected to the thin film transistor through the via hole 365 to be driven by the thin film transistor.

As mentioned above, areas occupied by the photosensitive layer patterns 377a and 377b can be minimized, and at the same time the upper portion of the via hole 365 as well as the groove 377*b* can also be planarized by the photosensitive layer patterns 377*a* and 377*b*. Such a configuration can not only suppress the deterioration of the organic emission layer 380 due to the outgas emitted from the photosensitive layer but can also suppress the deterioration due to the bending of the opposite electrode 390 and the organic emission layer 380. In addition, the photosensitive layer 377 is exposed to light incident from the lower surface of the substrate, wherein such exposure on the photosensitive layer. 377 is performed using the metal wiring and the active layer 310 on the pixel driving circuit region B as a mask, so that the number of masks can be reduced as compared to performing an exposure on the upper surface of the substrate using another photomask.

In accordance with the present invention as mentioned above, deterioration of the organic emission layer due to outgas emitted from a photosensitive layer can be minimized, and at the same time the deterioration due to bending of the opposite electrode and the organic emission layer can also be prevented.

While the present invention has been described with reference to a particular embodiment, it is understood that the disclosure has been made for purpose of illustrating the invention by way of example and is not to be construed as limiting the scope of the present invention. One skilled in the art can modify the present invention without departing from the scope and spirit of the present invention.

What is claimed is:

1. A display, comprising:
    a substrate including a pixel driving circuit region and an opening region;
    a thin film transistor positioned on top of the pixel driving circuit region and having source/drain electrodes;
    an insulating layer positioned on top of the source/drain electrodes having a via hole exposing one of the source/drain electrodes and having a groove above and extending below an uppermost top surface of another of the source/drain electrodes;
    a pixel electrode contacting the exposed source/drain electrode within the via hole and extending directly onto a top of the insulating layer to physically contact the insulating layer and to completely encircle the via hole, the insulating layer being between the source/drain electrodes and the pixel electrode;
    a first photosensitive layer pattern positioned within the via hole in which the pixel electrode is arranged and exposing a portion of the pixel electrode extending onto a top of the insulating layer and physically contacting the insulating layer and adjacent to the via hole,
    a top surface of the first photosensitive layer being no higher than the portion of the pixel electrode extending directly onto a top of the insulating layer;
    a second photosensitive layer pattern filling said groove in said insulating layer; and
    an organic emission layer positioned on top of the exposed pixel electrode and on an edge of the pixel electrode encircling the via hole to directly contact the edge of the pixel electrode encircling the via hole,
    wherein an upper surface of the via hole, an upper surface of said groove and an upper surface of said second photosensitive layer pattern are all in a same plane.

2. The display as claimed in claim 1, wherein the first photosensitive layer pattern comprises one of an acrylic-based polymer and an imide-based polymer.

3. The display as claimed in claim 1, wherein the insulating layer comprises an inorganic layer.

4. The display as claimed in claim 3, wherein the inorganic layer comprises a silicon nitride layer.

5. The display as claimed in claim 1, wherein the first photosensitive layer pattern exposes the portion of the pixel electrode around the via hole.

6. The display as claimed in claim 1, wherein the second photosensitive layer pattern comprises one of an acrylic-based polymer and an imide-based polymer.

7. The display as claimed in claim 1, wherein the pixel electrode comprises one of Indium Tin Oxide (ITO) and Indium Zinc Oxide (IZO).

8. The display as claimed in claim 1, wherein the pixel electrode includes a tapered edge.

9. The display as claimed in claim 8, wherein the tapered edge of the pixel electrode includes a taper angle less than or equal to 20 degrees with respect to a plane parallel to the substrate.

* * * * *